(12) United States Patent
Hirono et al.

(10) Patent No.: US 11,444,622 B2
(45) Date of Patent: Sep. 13, 2022

(54) PROXIMITY SENSOR (71) Applicant: Sony Semiconductor Solutions Corporation, Kanagawa (JP)

(72) Inventors: Daisuke Hirono, Kanagawa (JP); Katsuji Kimura, Kanagawa (JP); Yuki Urano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/294,255

(22) PCT Filed: Dec. 18, 2019

(86) PCT No.: PCT/JP2019/049552
§ 371 (c)(1),
(2) Date: May 14, 2021

(87) PCT Pub. No.: WO2020/137729
PCT Pub. Date: Jul. 2, 2020

(65) Prior Publication Data
US 2022/0021386 A1    Jan. 20, 2022

(30) Foreign Application Priority Data

Dec. 25, 2018    (JP) .............................. JP2018-240624

(51) Int. Cl.
*H03K 17/95* (2006.01)
(52) U.S. Cl.
CPC ................................. *H03K 17/952* (2013.01)
(58) Field of Classification Search
CPC .................................................. H03K 17/952
See application file for complete search history.

(56) References Cited

U.S. PATENT DOCUMENTS

| 2015/0277141 A1 | 10/2015 | Kim et al. |
| 2016/0316121 A1 | 10/2016 | Park |
| (Continued) | | |

FOREIGN PATENT DOCUMENTS

| WO | 2019/188387 A1 | 3/2019 |
| WO | 2019/198524 A1 | 10/2019 |

OTHER PUBLICATIONS

Guo et al, "Differential Structure of Inductive Proximity Sensor", May 13, 2019, MDPI, all pages (Year: 2019).*

(Continued)

*Primary Examiner* — Daniel C Puentes
(74) *Attorney, Agent, or Firm* — Michael Best & Friedrich LLP (57) ABSTRACT

A proximity sensor that detects the distance between two coils is disclosed. In one example, the proximity sensor includes a reference signal generation circuit, a first coil, a second coil, a clock signal generation circuit, and a switched capacitor circuit. The reference signal generation circuit applies a first alternating voltage to the first coil and transmits a reference signal synchronized with the first alternating voltage to the clock signal generation circuit. The second coil is coupled with the first coil by magnetic field coupling to generate a second alternating voltage correlated with a coupling coefficient. The clock signal generation circuit transmits clock signals corresponding to the reference signal to the switched capacitor circuit, and the switched capacitor circuit detects a distance between the first coil and the second coil by acquiring the second alternating voltage at a timing when each of the clock signals changes.

9 Claims, 6 Drawing Sheets

(56) References Cited

U.S. PATENT DOCUMENTS

2017/0139227 A1    5/2017  Kim et al.
2017/0264814 A1    9/2017  Park et al.

OTHER PUBLICATIONS

International Search Report (PCT/ISA/210), International Application No. PCT/JP2019/049552, dated Feb. 19, 2020.
Notification of Transmittal of the International Search Report and the Written Opinion of the International Searching Authority, or the Declaration (PCT/ISA/220), International Application No. PCT/JP2019/049552, dated Mar. 3, 2020.
Written Opinion of the International Search Authority (PCT/ISA/237), International Application No. PCT/JP2019/049552, dated Mar. 3, 2020.

* cited by examiner

PROXIMITY SENSOR

TECHNICAL FIELD

The present technology relates to a proximity sensor.

BACKGROUND ART

It is known that, in a case where the distance between an object to be sensed and a sensing coil is detected, the distance can be detected by analysis of the current flowing through the sensing coil or the like.

Patent Document 1 mentions that conductance indicating the degree of ease of flowing of current flowing through a sensing coil changes in accordance with the distance between an object to be sensed and the sensing coil.

CITATION LIST

Patent Document

Patent Document 1: Japanese Patent Application Laid-Open No. 2010-45532

SUMMARY OF THE INVENTION

Problems to be Solved by the Invention

There is a correlation between the distance between two coils coupled by magnetic field coupling and the amplitude of a pulse wave of induced electromotive force induced at one coil. Hence, the detection of the distance between two coils by acquisition of this amplitude is possible in theory.

However, this pulse wave is complexly distorted depending on the duty ratio or the like, and therefore in practice the acquisition of this amplitude is very difficult.

Thus, a main object of the present technology is to provide a proximity sensor that, while being a simple configuration, detects the distance between coils by acquiring the amplitude of a pulse wave of induced electromotive force occurring at a coil with high precision.

Solutions to Problems

According to the present technology, there is provided a proximity sensor including a reference signal generation circuit section, a first coil, a second coil, a clock signal generation circuit section, and a switched capacitor circuit section, in which the reference signal generation circuit section applies a first alternating voltage to the first coil and transmits a reference signal synchronized with the first alternating voltage to the clock signal generation circuit section, the second coil coupled with the first coil by magnetic field coupling generates a second alternating voltage correlated with a coupling coefficient of the first coil and the second coil, the clock signal generation circuit section transmits a plurality of clock signals corresponding to the reference signal to the switched capacitor circuit section, and the switched capacitor circuit section detects a distance between the first coil and the second coil by acquiring the second alternating voltage at a timing when each of the plurality of clock signals changes.

On the basis of the reference signal, the clock signal generation circuit section may transmit to the switched capacitor circuit section a first clock signal that changes at a timing immediately after the second alternating voltage has changed from a negative side to a positive side and a second clock signal that changes at a timing immediately before the second alternating voltage changes from the negative side to the positive side, and the switched capacitor circuit section may acquire a voltage difference between the second alternating voltage acquired at a timing when the first clock signal has changed and the second alternating voltage acquired at a timing when the second clock signal has changed.

The switched capacitor circuit section may include a plurality of charging switches, a plurality of discharging switches, a plurality of sampling capacitors, and a differential amplifier.

Each of the charging switches corresponds to any one of the plurality of clock signals and the charging switch corresponding to the clock signal may be set to ON or OFF at a timing when the clock signal has changed, each of the discharging switches corresponds to any one of the plurality of clock signals and the discharging switch corresponding to the clock signal may be set to ON or OFF at a timing when the clock signal has changed, each of the sampling capacitors corresponds to any one of the plurality of clock signals, and the second alternating voltage inputted to the switched capacitor circuit section is charged by the charging switch connected to the sampling capacitor being set to ON and the discharging switch connected to the sampling capacitor being set to OFF and the second alternating voltage may be discharged by the charging switch connected to the sampling capacitor being set to OFF and the discharging switch connected to the sampling capacitor being set to ON, and the differential amplifier may amplify the second alternating voltage discharged by each of the sampling capacitors and output a resulting voltage.

On the basis of the reference signal, the clock signal generation circuit section may transmit to the switched capacitor circuit section a third clock signal that changes at a timing immediately after the second alternating voltage has changed from the positive side to the negative side and a fourth clock signal that changes at a timing immediately before the second alternating voltage changes from the positive side to the negative side, the voltage difference may be taken as a first voltage difference, and the switched capacitor circuit section may acquire a second voltage difference between the second alternating voltage acquired at a timing when the third clock signal has changed and the second alternating voltage acquired at a timing when the fourth clock signal has changed, and the first voltage difference.

The switched capacitor circuit section may acquire a difference between the first voltage difference and the second voltage difference.

Furthermore, the present technology provides a proximity sensor further including an A/D converter, in which the A/D converter converts an output voltage of the switched capacitor circuit section to a digital signal and outputs a voltage signal.

Furthermore, the present technology provides a proximity sensor further including a coupling coefficient calculation section, in which the coupling coefficient calculation section calculates a coupling coefficient of the first coil and the second coil on the basis of the voltage signal.

Furthermore, the present technology provides a proximity sensor further including a negative capacitance circuit section, in which the negative capacitance circuit section reduces parasitic capacitance included in the second alternating voltage and resulting from the second coil.

MODE FOR CARRYING OUT THE INVENTION

Hereinbelow, preferred forms for implementing the present technology are described with reference to the appended drawings. Note that the embodiments described below show representative embodiments of the present technology and the scope of the present technology is not limited to these embodiments. Note that the description of the present technology is given in the following order.
1. First embodiment according to present technology (basic configuration)
2. Second embodiment according to present technology (A/D converter)
3. Third embodiment according to present technology (coupling coefficient calculation section)
4. Fourth embodiment according to present technology (negative capacitance circuit section)

1. First Embodiment According to Present Technology (Basic Configuration)

Figure 1:
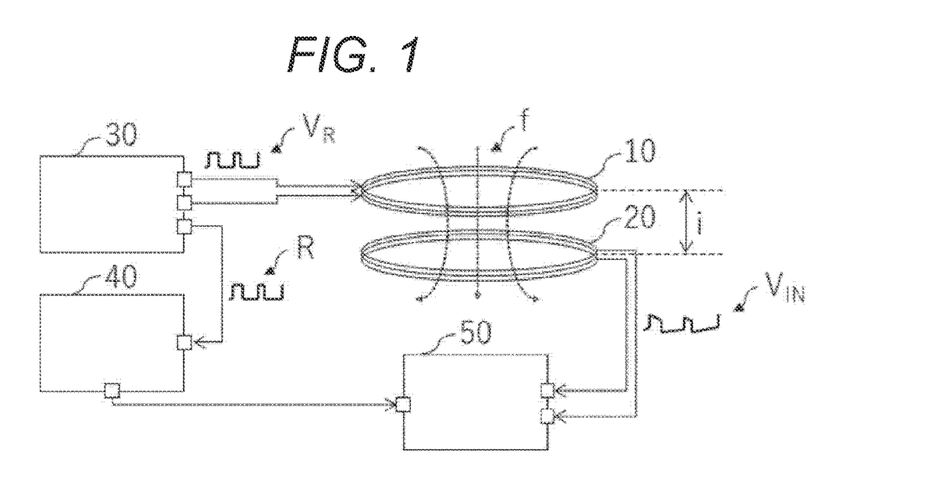
FIG. 1 is a diagram of an overall configuration of an embodiment of a proximity sensor according to the present technology.

A diagram of an overall configuration of an embodiment of a proximity sensor according to the present technology is shown in FIG. 1. As shown in FIG. 1, a proximity sensor according to the present technology includes a reference signal generation circuit section 30, a first coil 10, a second coil 20, a clock signal generation circuit section 40, and a switched capacitor circuit section 50.

The reference signal generation circuit section 30 and the first coil 10 are connected together. The reference signal generation circuit section 30 and the clock signal generation circuit section 40 are connected together. The clock signal generation circuit section 40 and the switched capacitor circuit section 50 are connected together. The switched capacitor circuit section 50 and the second coil 20 are connected together.

The reference signal generation circuit section 30 applies a first alternating voltage $V_R$ to the first coil 10. In addition, the reference signal generation circuit section 30 transmits a reference signal R synchronized with the first alternating voltage $V_R$ to the clock signal generation circuit section 40.

The reference signal R has information of High segments of the first alternating voltage $V_R$. Note that the pulse wave of the reference signal R and the pulse wave of the first alternating voltage $V_R$ may be the same shape.

The first coil 10 and the second coil 20 are coupled by magnetic field coupling. Hence, if the first alternating voltage $V_R$ is applied to the first coil 10, a magnetic field f occurs in the interior of the first coil 10. If the first coil 10 and the second coil 20 are close to each other, the magnetic field f of the first coil 10 affects the second coil, and induced electromotive force occurs in the second coil 20 in accordance with the magnitude of the coupling coefficient of the first coil 10 and the second coil 20. This induced electromotive force is referred to as a second alternating voltage $V_{IN}$.

It is known that there is a correlation between this coupling coefficient and the distance i between the coils. Therefore, the distance i between the coils can be derived from the amplitude of the pulse wave of the second alternating voltage $V_{IN}$. Note that a specific derivation procedure is described later.

Note that, although in FIG. 1 the interiors of the first coil 10 and the second coil 20 are hollow, an iron core or the like may be inserted through the interior of the first coil 10 or the second coil 20 in order to increase the induced electromotive force occurring in the second coil 20.

The clock signal generation circuit section 40 transmits a plurality of clock signals corresponding to the reference signal R to the switched capacitor circuit section 50. The switched capacitor circuit section 50 acquires the second alternating voltage $V_{IN}$ at a timing when each of the plurality of clock signals changes.

As a more detailed description, on the basis of the reference signal R, the clock signal generation circuit section 40 transmits to the switched capacitor circuit section 50 a first clock signal that changes at a timing immediately after the pulse wave of the second alternating voltage $V_{IN}$ has changed from the negative side to the positive side and a second clock signal that changes at a timing immediately before the pulse wave of the second alternating voltage $V_{IN}$ changes from the negative side to the positive side. The reference signal R and the first alternating voltage $V_R$ are in synchronization, and also the first alternating voltage $V_R$ and the second alternating voltage $V_{IN}$ are in synchronization by magnetic field coupling. Hence, the synchronization of these pulse waves is possible.

Then, the switched capacitor circuit section 50 acquires the voltage difference between the second alternating voltage $V_{IN}$ acquired at a timing when the first clock signal has changed and the second alternating voltage $V_{IN}$ acquired at a timing when the second clock signal has changed. This voltage difference is the amplitude of the pulse wave of the second alternating voltage $V_{IN}$. The above operation will now be described with reference to FIG. 2.

Figure 2:
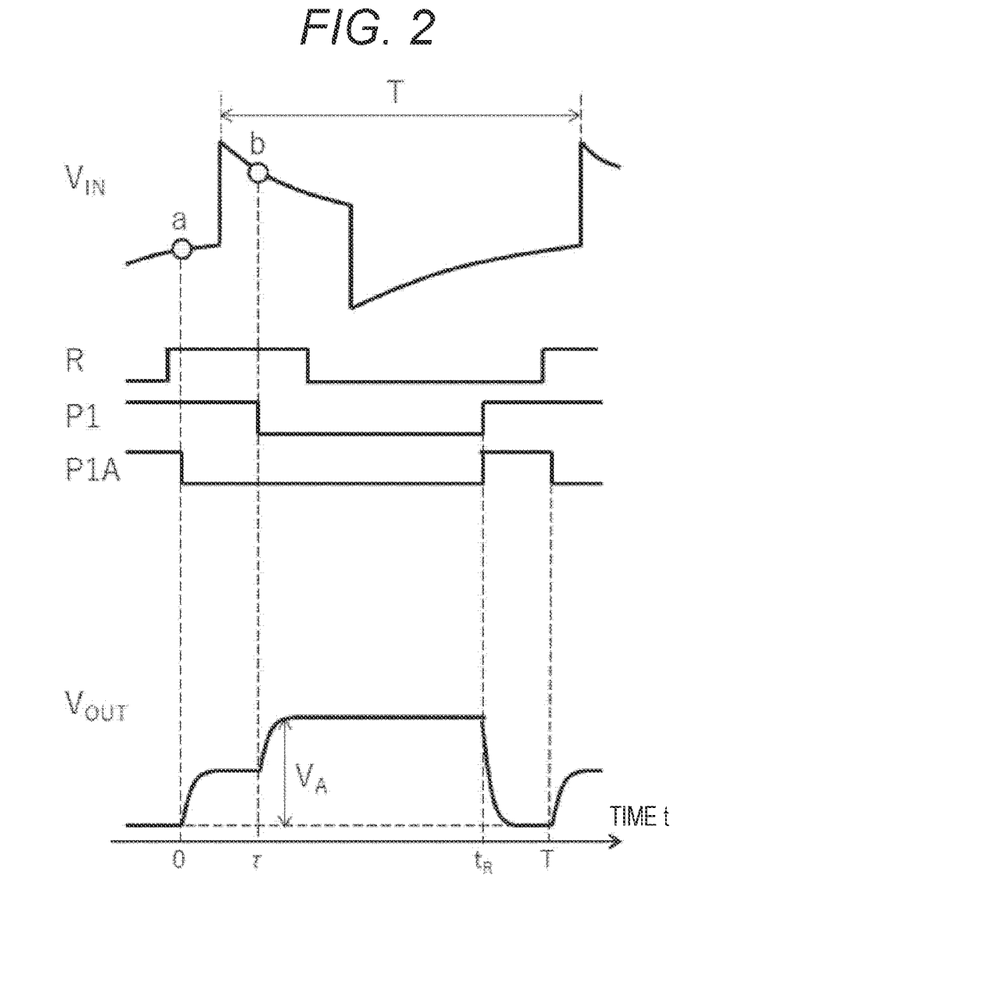
FIG. 2 is a timing chart of pulse waves of voltages and signals according to the present technology.

FIG. 2 shows an image of a pulse wave of a second alternating voltage $V_{IN}$, a timing chart of a reference signal R generated by the reference signal generation circuit section 30, a timing chart of a first clock signal P1 and a second clock signal P1A generated by the clock signal generation circuit section 40, and an image of a pulse wave of an output voltage $V_{OUT}$ of the clock signal generation circuit section 40.

The period of the pulse wave of the second alternating voltage $V_{IN}$ is denoted by T, the duty ratio of the pulse wave of the second alternating voltage $V_{IN}$ is denoted by D (0<D<1), and the interval (sampling interval) at which the amplitude of the pulse wave of the second alternating voltage $V_{IN}$ is acquired is denoted by τ.

The pulse wave of the second alternating voltage $V_{IN}$ is a distorted waveform. Further, although the pulse wave of the second alternating voltage $V_{IN}$ is shown in a simple waveform for the description of the present technology, in practice it can be a complexly changing waveform.

A timing when the pulse wave of the second alternating voltage $V_{IN}$ changes and a timing when the reference signal R changes are in synchronization. As a detailed description, after the reference signal R changes from the negative side to the positive side and a prescribed time (DT) elapses, the pulse wave of the second alternating voltage $V_{IN}$ changes from the negative side to the positive side. Further, after the reference signal R changes from the positive side to the negative side and a prescribed time (DT) elapses, the pulse wave of the second alternating voltage $V_{IN}$ changes from the positive side to the negative side.

Furthermore, a timing when the reference signal R changes from the negative side to the positive side and a timing when the second clock signal P1A changes from the positive side to the negative side are in synchronization. As a detailed description, after the reference signal R changes from the negative side to the positive side and a prescribed time elapses, the second clock signal P1A changes from the positive side to the negative side. Hence, a timing when the second clock signal P1A changes from the positive side to the negative side can be prescribed on the basis of the reference signal R.

A timing when the second clock signal P1A changes from the positive side to the negative side is taken as a starting point (time t=0); at the timing of time t=τ, the first clock signal P1 changes from the positive side to the negative side.

In other words, at timing "b" immediately after the second alternating voltage $V_{IN}$ has changed from the negative side to the positive side, the first clock signal P1 changes from the positive side to the negative side. At timing "a" immediately before the second alternating voltage $V_{IN}$ changes from the negative side to the positive side, the second clock signal P1A changes from the positive side to the negative side.

The switched capacitor circuit section 50 acquires the second alternating voltage $V_{IN}$ at timing "b" (time t=τ) when the first clock signal P1 has changed from the positive side to the negative side. Similarly, the switched capacitor circuit section 50 acquires the second alternating voltage $V_{IN}$ at timing "a" (time t=0) when the second clock signal P1A has changed from the positive side to the negative side. Then, the switched capacitor circuit section 50 acquires the voltage difference between the second alternating voltage $V_{IN}$ at timing "b" and the second alternating voltage $V_{IN}$ at timing "a". This voltage difference becomes the amplitude of the pulse wave of the second alternating voltage $V_{IN}$.

This voltage difference is outputted as an output voltage $V_{OUT}$ of the switched capacitor circuit section 50. The output voltage $V_{OUT}$ increases each time the second alternating voltage $V_{IN}$ is acquired, and is reset at the timing of time t=$t_R$.

Note that, although the switched capacitor circuit section 50 acquires the second alternating voltage $V_{IN}$ at timings when the first clock signal P1 and the second clock signal P1A have changed from the positive side to the negative side, the switched capacitor circuit section 50 may acquire the second alternating voltage $V_{IN}$ at timings when the first clock signal P1 and the second clock signal P1A have changed from the negative side to the positive side.

Figure 3:
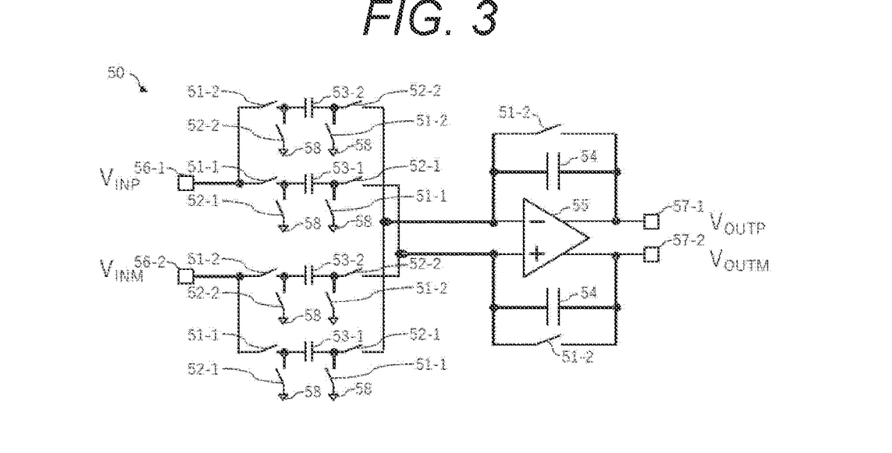
FIG. 3 is a circuit diagram of an embodiment of a switched capacitor circuit according to the present technology.

Next, a circuit diagram of an embodiment of the switched capacitor circuit section 50 is shown in FIG. 3.

As shown in FIG. 3, the switched capacitor circuit section 50 includes a plurality of charging switch groups (51-1, 51-2), a plurality of discharging switch groups (52-1, 52-2), a plurality of sampling capacitor groups (53-1, 53-2), and a differential amplifier 55.

Furthermore, the switched capacitor circuit section 50 may include a feedback capacitor group 54, input terminals (56-1, 56-2), output terminals (57-1, 57-2), and a ground group 58.

The plurality of charging switch groups (51-1, 51-2) is placed between the plurality of sampling capacitor groups (53-1, 53-2) and the input terminals (56-1, 56-2) or between the plurality of sampling capacitor groups (53-1, 53-2) and the ground group 58.

Further, the plurality of discharging switch groups (52-1, 52-2) is placed between the plurality of sampling capacitor groups (53-1, 53-2) and the differential amplifier 55 or between the plurality of sampling capacitor groups (53-1, 53-2) and the ground group 58.

The differential amplifier 55 is placed between the plurality of discharging switch groups (52-1, 52-2) and the output terminals (57-1, 57-2).

The second charging switch group 51-2 and the feedback capacitor group 54 are placed in parallel to the differential amplifier 55.

Next, an operation of the plurality of charging switch groups (51-1, 51-2) and the plurality of discharging switch groups (52-1, 52-2) is described. Each charging switch group (51-1, 51-2) corresponds to any one of a plurality of clock signals. Then, at a timing when a clock signal has changed, the charging switch group (51-1, 51-2) corresponding to the clock signal is set to ON or OFF.

In this example, the first charging switch group 51-1 corresponds to the first clock signal P1. The second charging switch group 51-2 corresponds to the second clock signal P1A. At a timing when the first clock signal P1 has changed, the first charging switch group 51-1 is set to ON or OFF. At a timing when the second clock signal P1A has changed, the second charging switch group 51-2 is set to ON or OFF.

Further, each discharging switch group (52-1, 52-2) corresponds to any one of a plurality of clock signals. Then, at a timing when a clock signal has changed, the discharging switch group (52-1, 52-2) corresponding to the clock signal is set to ON or OFF.

In this example, the first discharging switch group 52-1 corresponds to the first clock signal P1. The second discharging switch group 52-2 corresponds to the second clock signal P1A. At a timing when the first clock signal P1 has changed, the first discharging switch group 52-1 is set to ON or OFF. At a timing when the second clock signal P1A has changed, the second discharging switch group 52-2 is set to ON or OFF.

Then, each sampling capacitor group (53-1, 53-2) corresponds to any one of a plurality of clock signals.

In this example, the first sampling capacitor group 53-1 corresponds to the first clock signal P1. The second sampling capacitor group 53-2 corresponds to the second clock signal P1A.

Next, an operation of the switched capacitor circuit section 50 is described. A second alternating voltage $V_{IN}(=V_{IN}-V_{INM})$ is inputted to the switched capacitor circuit section 50, and the switched capacitor circuit section 50 outputs an output voltage $V_{OUT}$ ($=V_{OUTP}-V_{OUTM}$).

At the time of charging, the plurality of charging switch groups (51-1, 51-2) connected to the plurality of sampling capacitor groups (53-1, 53-2) is set to ON, and the plurality of discharging switch groups (52-1, 52-2) connected to the plurality of sampling capacitor groups (53-1, 53-2) is set to OFF. Thereby, the plurality of sampling capacitor groups (53-1, 53-2) charges the second alternating voltage $V_{IN}$ inputted to the switched capacitor circuit section 50.

In this example, the first charging switch group 51-1 connected to the first sampling capacitor group 53-1 is set to ON, and the first discharging switch group 52-1 connected to the first sampling capacitor group 53-1 is set to OFF. Thereby, the first sampling capacitor group 53-1 charges the second alternating voltage $V_{IN}$ inputted to the switched capacitor circuit section 50.

Similarly, in this example, the second charging switch group 51-2 connected to the second sampling capacitor group 53-2 is set to ON, and the second discharging switch group 52-2 connected to the second sampling capacitor group 53-2 is set to OFF. Thereby, the second sampling capacitor group 53-2 charges the second alternating voltage $V_{IN}$ inputted to the switched capacitor circuit section 50.

Meanwhile, at the time of discharging, the plurality of charging switch groups (51-1, 51-2) connected to the plurality of sampling capacitor groups (53-1, 53-2) is set to OFF, and the plurality of discharging switch groups (52-1, 52-2) connected to the plurality of sampling capacitor groups (53-1, 53-2) is set to ON. Thereby, the plurality of sampling capacitor groups (53-1, 53-2) discharges the second alternating voltage $V_{IN}$ charged in the plurality of sampling capacitor groups (53-1, 53-2).

In this example, at a timing (time t=0 of FIG. 2) when the second clock signal P1A has changed from the positive side to the negative side, the second charging switch group 51-2 connected to the second sampling capacitor group 53-2 is set to OFF, and the second discharging switch group 52-2 connected to the second sampling capacitor group 53-2 is set to ON. Thereby, the second sampling capacitor group 53-2 discharges the second alternating voltage Vo charged in the second sampling capacitor group 53-2.

Thereby, the switched capacitor circuit section 50 can acquire the second alternating voltage $V_{IN}(0)$ at time t=0 of FIG. 2.

Similarly, in this example, at a timing (time t=τ of FIG. 2) when the first clock signal P1 has changed from the positive side to the negative side, the first charging switch group 51-1 connected to the first sampling capacitor group 53-1 is set to OFF, and the first discharging switch group 52-1 connected to the first sampling capacitor group 53-1 is set to ON.

Thereby, the first sampling capacitor group 53-1 discharges the second alternating voltage $V_{IN}$ charged in the first sampling capacitor group 53-1.

Thereby, the switched capacitor circuit section 50 can acquire the second alternating voltage $V_{IN}(\tau)$ at time t=τ of FIG. 2.

The discharged second alternating voltage $V_{IN}$ is inputted to the differential amplifier 55. The differential amplifier 55 amplifies the second alternating voltage $V_{IN}$ discharged by each sampling capacitor group, and outputs the resulting voltage.

In this example, the differential amplifier 55 amplifies the second alternating voltages $V_{IN}$ discharged by the first sampling capacitor group 53-1 and the second sampling capacitor group 53-2, and outputs the resulting voltages.

The output voltage $V_A$ of the switched capacitor circuit section 50 at this time (see FIG. 2) can be expressed by Formula (1) below. $C_S$ represents the capacitance of the sampling capacitor group (53-1, 53-2). $C_F$ represents the capacitance of the feedback capacitor group 54.

$$V_A = \{V_{IN}(\tau) - V_{IN}(0)\} \times C_S/C_F \qquad (1)$$

This $\{V_{IN}(\tau) - V_{IN}(0)\}$ is the voltage difference between the second alternating voltage $V_{IN}(\tau)$ acquired at a timing (time t=τ) when the first clock signal P1 has changed and the second alternating voltage $V_{IN}(0)$ acquired at a timing (time t=0) when the second clock signal P1A has changed, and is the amplitude of the pulse wave of the second alternating voltage $V_{IN}$.

Further, this $C_S/C_F$ is the voltage amplification factor of the switched capacitor circuit section 50.

Note that, although in the present embodiment the amplitude of a rise edge (a change from the negative side to the positive side) of the pulse wave of the second alternating voltage $V_{IN}$ is acquired, it is also possible to acquire the amplitude of a fall edge (a change from the positive side to the negative side) of the pulse wave of the second alternating voltage $V_{IN}$.

Although even the amplitude of either of a rise edge and a fall edge of the pulse wave of the second alternating voltage $V_{IN}$ by itself enables the detection of the distance i between the coils, more preferably the switched capacitor circuit section 50 acquires the amplitudes of both of a rise edge and a fall edge of the pulse wave of the second alternating voltage $V_{IN}$.

Referring to FIG. 1 again, on the basis of the reference signal R, the clock signal generation circuit section 40 transmits, in addition to the first clock signal and the second clock signal described above, a third clock signal that changes at a timing immediately after the pulse wave of the second alternating voltage $V_{IN}$ has changed from the positive side to the negative side and a fourth clock signal that changes at a timing immediately before the pulse wave of the second alternating voltage $V_{IN}$ changes from the positive side to the negative side to the switched capacitor circuit section 50. That is, the clock signal generation circuit section 40 transmits the first to fourth clock signals to the switched capacitor circuit section 50.

Then, the voltage difference $\{V_{IN}(\tau) - V_{IN}(0)\}$ described above is defined as a first voltage difference. The switched capacitor circuit section 50 acquires a second voltage difference that is the voltage difference between the second alternating voltage $V_{IN}$ acquired at a timing when the third clock signal has changed and the second alternating voltage $V_{IN}$ acquired at a timing when the fourth clock signal has changed, and the first voltage difference. The above operation will now be described with reference to FIG. 4. Note that a description of the parts overlapping between FIG. 4 and FIG. 2 is omitted.

Figure 4:
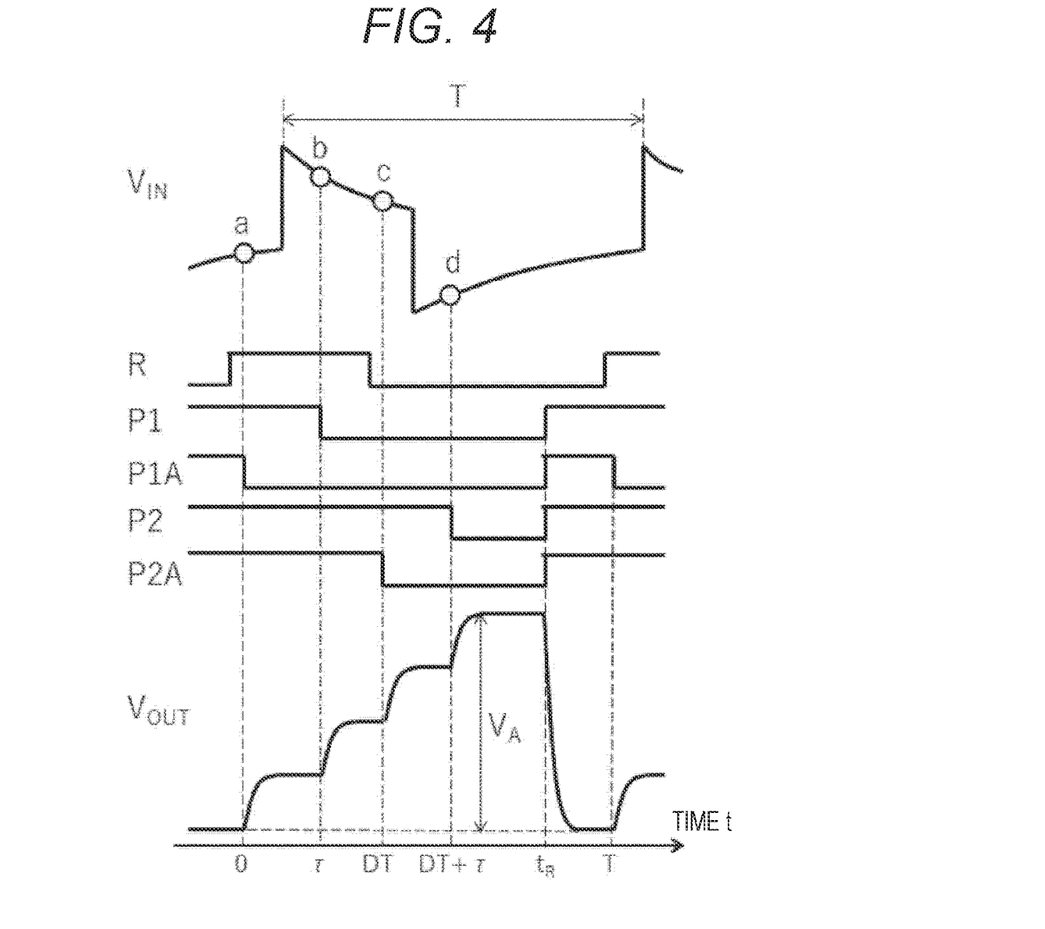
FIG. 4 is a timing chart of pulse waves of voltages and signals according to the present technology.

FIG. 4 shows an image of a pulse wave of a second alternating voltage $V_{IN}$, a timing chart of a reference signal R generated by the reference signal generation circuit section 30, a timing chart of a first clock signal P1, a second clock signal P1A, a third clock signal P2, and a fourth clock signal P2A generated by the clock signal generation circuit section 40, and an image of a pulse wave of an output voltage $V_{OUT}$ of the clock signal generation circuit section 40.

A timing when the reference signal R changes from the positive side to the negative side and a timing when the fourth clock signal P2A changes from the positive side to the negative side are in synchronization. As a detailed description, after the reference signal R changes from the positive side to the negative side and a prescribed time elapses, the fourth clock signal P2A changes from the positive side to the negative side. Further, a timing when the reference signal R changes from the positive side to the negative side can be prescribed on the basis of the duty ratio D. Therefore, a timing when the fourth clock signal P2A changes from the positive side to the negative side can be prescribed on the basis of the reference signal R and the duty ratio D.

A timing when the second clock signal P1A changes from the positive side to the negative side is taken as a starting point (time t=0); at the timing of time t=DT, the fourth clock signal P2A changes from the positive side to the negative side. Furthermore, at the timing of time t=DT+τ, the third clock signal P2 changes from the positive side to the negative side.

In other words, at timing "d" immediately after the second alternating voltage $V_{IN}$ has changed from the positive side to the negative side, the third clock signal P2 changes from the positive side to the negative side. At timing "c" immediately before the second alternating voltage $V_{IN}$ changes from the positive side to the negative side, the fourth clock signal P2A changes from the positive side to the negative side.

Note that time DT depends on the duty ratio D. Further, time DT+τ is the time obtained by adding the sampling interval τ to time DT.

The switched capacitor circuit section 50 acquires the second alternating voltage $V_{IN}$ at timing "d" (time t=DT+τ) when the third clock signal P2 has changed from the positive side to the negative side. Similarly, the switched capacitor circuit section 50 acquires the second alternating voltage $V_{IN}$ at timing "c" (time t=DT) when the fourth clock signal P2A has changed from the positive side to the negative side. Then, the switched capacitor circuit section 50 acquires the voltage difference between the second alternating voltage $V_{IN}$ at timing "d" and the second alternating voltage $V_{IN}$ at timing "c" (the second voltage difference).

Note that, although the switched capacitor circuit section 50 acquires the second alternating voltage $V_{IN}$ at timings when the third clock signal P2 and the fourth clock signal P2A have changed from the positive side to the negative side, the switched capacitor circuit section 50 may acquire the second alternating voltage $V_{IN}$ at timings when the third clock signal P2 and the fourth clock signal P2A have changed from the negative side to the positive side.

Figure 5:
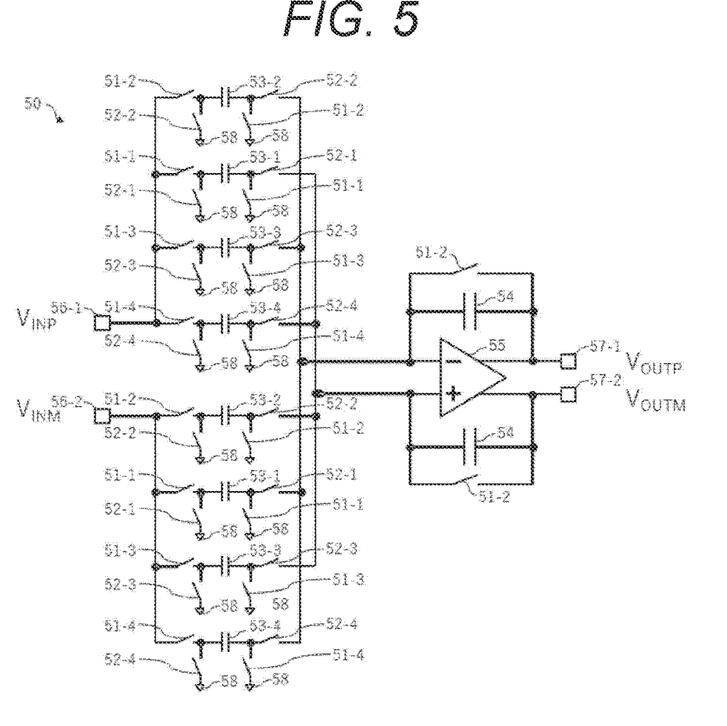
FIG. 5 is a circuit diagram of an embodiment of a switched capacitor circuit according to the present technology.

Next, a circuit diagram of an embodiment of the switched capacitor circuit section 50 is shown in FIG. 5. Note that a description of the parts overlapping between FIG. 5 and FIG. 3 is omitted.

As shown in FIG. 5, the switched capacitor circuit section 50 includes a plurality of charging switch groups (51-1 to 4), a plurality of discharging switch groups (52-1 to 4), a plurality of sampling capacitor groups (53-1 to 4), and a differential amplifier 55.

Furthermore, the switched capacitor circuit section 50 may include a feedback capacitor group 54, input terminals (56-1, 56-2), output terminals (57-1, 57-2), and a ground group 58.

The plurality of charging switch groups (51-1 to 4) is placed between the plurality of sampling capacitor groups (53-1 to 4) and the input terminals (56-1, 56-2) or between the plurality of sampling capacitor groups (53-1 to 4) and the ground group 58.

Further, the plurality of discharging switch groups (52-1 to 4) is placed between the plurality of sampling capacitor groups (53-1 to 4) and the differential amplifier 55 or between the plurality of sampling capacitor groups (53-1 to 4) and the ground group 58.

The differential amplifier 55 is placed between the plurality of discharging switch groups (52-1 to 4) and the output terminals (57-1, 57-2).

The second charging switch group 51-2 and the feedback capacitor group 54 are placed in parallel to the differential amplifier 55.

Next, an operation of the plurality of charging switch groups (51-1 to 4) and the plurality of discharging switch groups (52-1 to 4) is described.

The third charging switch group 51-3 corresponds to the third clock signal P2. The fourth charging switch group 51-4 corresponds to the fourth clock signal P2A. At a timing when the third clock signal P2 has changed, the third charging switch group 51-3 is set to ON or OFF. At a timing when the fourth clock signal P2A has changed, the fourth charging switch group 51-4 is set to ON or OFF.

The third discharging switch group 52-3 corresponds to the third clock signal P2. The fourth discharging switch group 52-4 corresponds to the fourth clock signal P2A. At a timing when the third clock signal P2 has changed, the third discharging switch group 52-3 is set to ON or OFF. At a timing when the fourth clock signal P2A has changed, the fourth discharging switch group 52-4 is set to ON or OFF.

The third sampling capacitor group 53-3 corresponds to the third clock signal P2. The fourth sampling capacitor group 53-4 corresponds to the fourth clock signal P2A.

Next, an operation of the switched capacitor circuit section 50 is described.

At the time of charging, the third charging switch group 51-3 connected to the third sampling capacitor group 53-3 is set to ON, and the third discharging switch group 52-3 connected to the third sampling capacitor group 53-3 is set to OFF. Thereby, the third sampling capacitor group 53-3 charges the second alternating voltage $V_{IN}$ inputted to the switched capacitor circuit section 50.

Similarly, the fourth charging switch group 51-4 connected to the fourth sampling capacitor group 53-4 is set to ON, and the fourth discharging switch group 52-4 connected to the fourth sampling capacitor group 53-4 is set to OFF. Thereby, the fourth sampling capacitor group 53-4 charges the second alternating voltage Vo inputted to the switched capacitor circuit section 50.

At the time of discharging, at a timing (time t=DT of FIG. 4) when the fourth clock signal P2A has changed from the positive side to the negative side, the fourth charging switch group 51-4 connected to the fourth sampling capacitor group 53-4 is set to OFF, and the fourth discharging switch group 52-4 connected to the fourth sampling capacitor group 53-4 is set to ON. Thereby, the fourth sampling capacitor group 53-4 discharges the second alternating voltage $V_{IN}$ charged in the fourth sampling capacitor group 53-4.

Thereby, the switched capacitor circuit section 50 can acquire the second alternating voltage $V_{IN}(DT)$ at time t=DT of FIG. 4.

Similarly, at a timing (time t=DT+τ of FIG. 4) when the third clock signal P2 has changed from the positive side to the negative side, the third charging switch group 51-3 connected to the third sampling capacitor group 53-3 is set to OFF, and the third discharging switch group 52-3 connected to the third sampling capacitor group 53-3 is set to ON. Thereby, the third sampling capacitor group 53-3 discharges the second alternating voltage $V_{IN}$ charged in the third sampling capacitor group 53-3.

Thereby, the switched capacitor circuit section 50 can acquire the second alternating voltage $V_{IN}(DT+τ)$ at time t=DT+τ of FIG. 4.

The differential amplifier 55 amplifies the second alternating voltage $V_{IN}$ discharged by each of the first to fourth sampling capacitor groups (53-1 to 4), and outputs the resulting voltage.

The output voltage $V_A$ of the switched capacitor circuit section 50 at this time (see FIG. 4) can be expressed by Formula (2) below.

$$V_A = \{[V_{IN}(τ) - V_{IN}(0)] - [V_{IN}(DT+τ) - V_{IN}(DT)]\} \times C_S/C_F \quad (2)$$

This $\{V_{IN}(τ) - V_{IN}(0)\}$ is the voltage difference between the second alternating voltage $V_{IN}(T)$ acquired at a timing (time t=τ) when the first clock signal P1 has changed and the second alternating voltage $V_{IN}(0)$ acquired at a timing (time t=0) when the second clock signal P1A has changed (the first voltage difference).

This $\{V_{IN}(DT+τ) - V_{IN}(DT)\}$ is the voltage difference between the second alternating voltage $V_{IN}(DT+τ)$ acquired at a timing (time t=DT+τ) when the third clock signal P2 has changed and the second alternating voltage $V_{IN}(DT)$ acquired at a timing (time t=DT) when the fourth clock signal P2A has changed (the second voltage difference), and is the amplitude of the pulse wave of the second alternating voltage $V_{IN}$.

That is, the switched capacitor circuit section 50 acquires the difference between the first voltage difference and the second voltage difference. In other words, the switched capacitor circuit section 50 acquires both of the amplitude of a rise edge (a change from the negative side to the positive side) of the pulse wave of the second alternating voltage $V_{IN}$ and the amplitude of a fall edge (a change from the positive side to the negative side) of the pulse wave of the second alternating voltage $V_{IN}$.

In general, this voltage difference varies with the distortion of the waveform of the second alternating voltage $V_{IN}$ depending on parasitic resistance, parasitic capacitance, or the duty ratio D. However, in the present technology, since the switched capacitor circuit section 50 acquires the voltages of both a rise edge and a fall edge of the second alternating voltage $V_{IN}$, this dependence can be lessened.

Furthermore, in the present technology, since the switched capacitor circuit section 50 acquires the voltages of both a rise edge and a fall edge of the second alternating voltage $V_{IN}$, the output voltage $V_{OUT}$ is approximately twice the second alternating voltage $V_{IN}$, which is the input voltage.

Hence, the S/N ratio is increased, and the influence of DC offset or noise can be reduced.

2. Second Embodiment According to Present Technology (A/D Converter)

Figure 6:
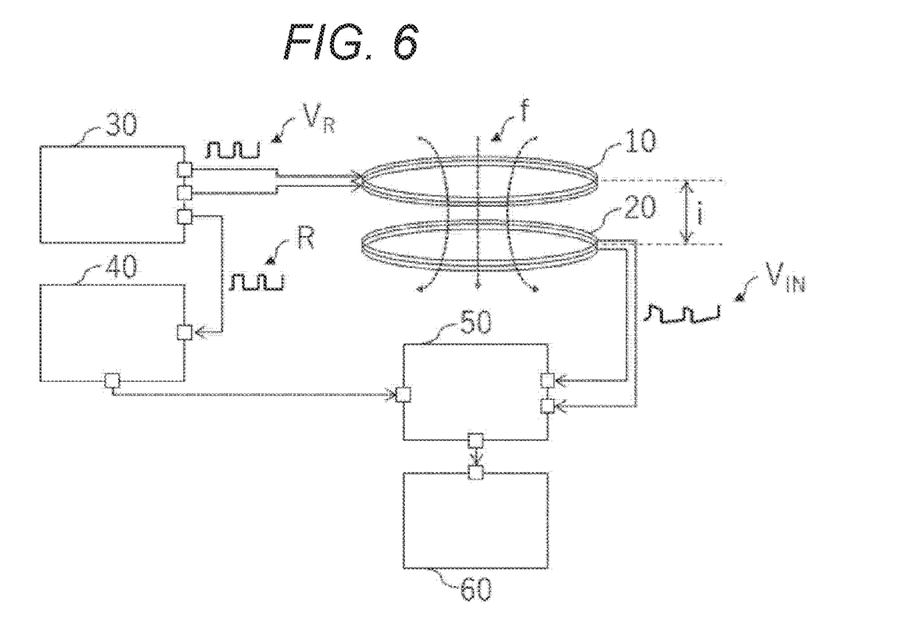
FIG. 6 is a diagram of an overall configuration of an embodiment of a proximity sensor according to the present technology.

A diagram of an overall configuration of an embodiment of a proximity sensor according to the present technology is shown in FIG. 6. Note that a description of the parts overlapping between FIG. 6 and FIG. 1 is omitted.

As shown in FIG. 6, a proximity sensor according to the present technology may further include an A/D converter 60. The A/D converter 60 converts an output voltage $V_{OUT}$ of the switched capacitor circuit section 50 to a digital signal, and outputs a voltage signal.

The calculation of the coupling coefficient is enabled by the A/D converter 60 converting an output voltage $V_{OUT}$ to a digital signal.

3. Third Embodiment According to Present Technology (Coupling Coefficient Calculation Section)

Figure 7:
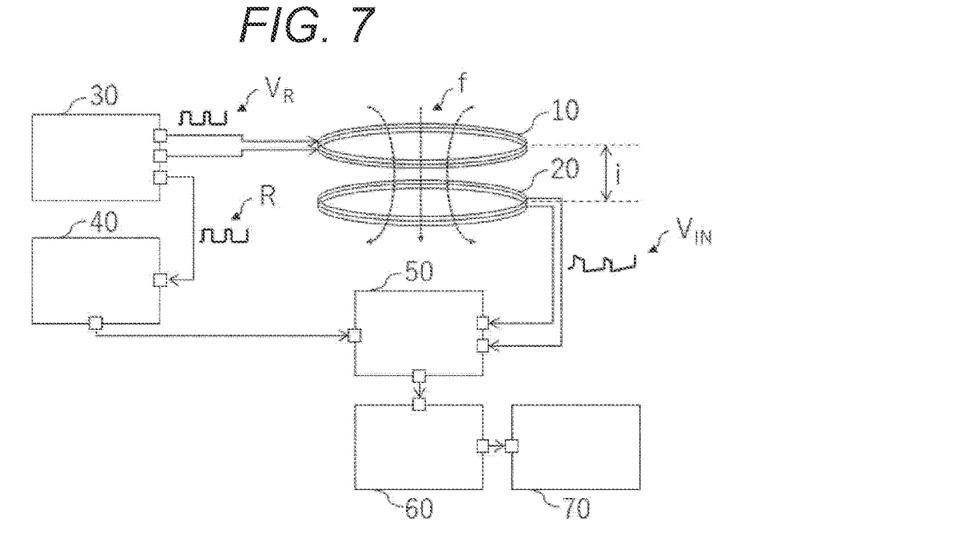
FIG. 7 is a diagram of an overall configuration of an embodiment of a proximity sensor according to the present technology.

A diagram of an overall configuration of an embodiment of a proximity sensor according to the present technology is shown in FIG. 7. Note that a description of the parts overlapping between FIG. 7 and FIG. 1 is omitted.

As shown in FIG. 7, a proximity sensor according to the present technology may further include a coupling coefficient calculation section 70. The coupling coefficient calculation section 70 calculates the coupling coefficient k of the first coil 10 and the second coil 20 on the basis of a voltage signal outputted by the A/D converter 60.

A method for calculating the coupling coefficient k will now be described. The induced electromotive force (the second alternating voltage $V_{IN}$) is correlated with the mutual inductance M of the first coil 10 and the second coil 20. If the current flowing through the first coil 10 is denoted by $\Delta I_1$ and the time when the current $\Delta I_1$ flows is by $\Delta t$, the second alternating voltage $V_{IN}$ can be calculated by Formula (3) below.

$$V_{IN} = M \times \Delta I_1 / \Delta t \quad (3)$$

If the self-inductance of the first coil 10 is denoted by $L_1$ and the self-inductance of the second coil 20 is by $L_2$, the coupling coefficient k can be calculated by Formula (4) below.

$$k = M/\sqrt{(L_1 \times L_2)} \quad (4)$$

Therefore, a relationship between the coupling coefficient k and the induced electromotive force $V_{IN}$ can be expressed by Formula (5) below.

$$k = V_{IN} \times \Delta t / \Delta I_1 \times \sqrt{(L_1 \times L_2)} \quad (5)$$

The coupling coefficient k is correlated with the distance i between the first coil 10 and the second coil 20. Therefore, the distance i between the first coil 10 and the second coil 20 can be detected on the basis of the induced electromotive force (the second alternating voltage $V_{IN}$).

Note that the switched capacitor circuit section 50 may have an A/D conversion function and may have a coupling coefficient calculation function. Further, the A/D converter 60 may have a coupling coefficient calculation function.

4. Fourth Embodiment According to Present Technology (Negative Capacitance Circuit Section)

Figure 8:
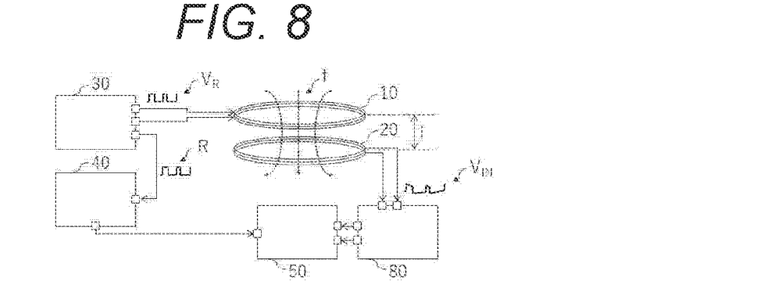
FIG. 8 is a diagram of an overall configuration of an embodiment of a proximity sensor according to the present technology.

A diagram of an overall configuration of a proximity sensor according to the present technology is shown in FIG.

8. Note that a description of the parts overlapping between FIG. 8 and FIG. 1 is omitted.

As shown in FIG. 8, a proximity sensor according to the present technology may further include a negative capacitance circuit section 80. The negative capacitance circuit section 80 can reduce parasitic capacitance included in the second alternating voltage $V_{IN}$ and resulting from the second coil 20.

The parasitic capacitance is a capacitance component resulting from the physical structure of the element in an electronic circuit or the like. For example, in a case where there is a potential difference between both ends of a coil, coil wires adjacent with different electric potentials behave like electrode plates of a capacitor, and accumulate electric charge. Hence, a surplus current for making accumulation of electricity or discharging flows.

In a low-frequency circuit in which voltage changes at relatively low speed, this surplus current is often negligible. However, in a high-frequency circuit in which voltage changes at relatively high speed, this charging current is large, and interferes with the operation of the circuit. As a result, the pulse wave of voltage can be a distorted waveform.

Figure 9:
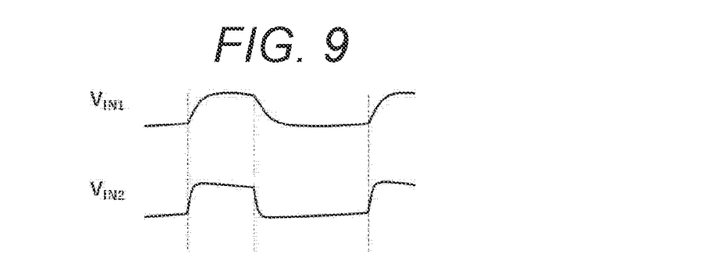
FIG. 9 is examples of pulse waves of voltages according to the present technology.

This will now be described with reference to FIG. 9. FIG. 9 is an example of a pulse wave of the second alternating voltage $V_{IN}$.

In FIG. 9, $V_{IN1}$ shows a second alternating voltage with large parasitic capacitance. Depending on the physical structure of the second coil 20, the pulse wave can thus be a distorted waveform.

$V_{IN2}$ shows a second alternating voltage with small parasitic capacitance. The parasitic capacitance is reduced, and the distortion of the pulse wave is reduced.

The negative capacitance circuit section 80 uses negative capacitance to reduce parasitic capacitance included in an inputted second alternating voltage $V_{IN1}$ with large parasitic capacitance, and outputs a second alternating voltage $_{IN2}$ with small parasitic capacitance. Since the distortion of the pulse wave of the second alternating voltage $_{IN2}$ is small, the switched capacitor circuit 50 can sense the amplitude of a rise edge or a fall edge of the pulse wave with high precision.

Note that, although in FIG. 8 the numbers of input terminals and output terminals of the negative capacitance circuit section 80 are each two, they may each be one. In a case where the negative capacitance circuit section 80 is differential wiring, the numbers of input terminals and output terminals of the negative capacitance circuit section 80 may each be two. In a case where the negative capacitance circuit section 80 is single-end wiring, the numbers of input terminals and output terminals of the negative capacitance circuit section 80 may each be one.

Figure 10:
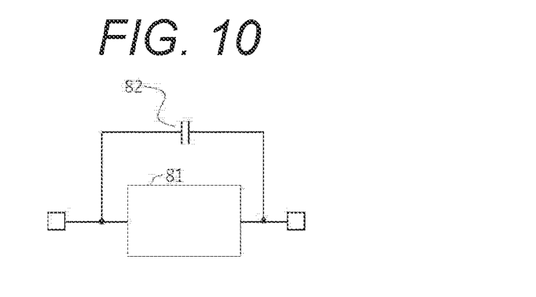
FIG. 10 is a schematic diagram of an embodiment of a negative capacitance circuit section according to the present technology.

A configuration of the negative capacitance circuit section 80 will now be described with reference to FIG. 10. FIG. 10 is a schematic diagram of an embodiment of the negative capacitance circuit section 80 according to the present technology. As shown in FIG. 10, the negative capacitance circuit section 80 includes at least an amplification section 81 and a feedback capacitor 82.

The amplification section 81 has the function of multiplying an inputted voltage by "A" times and outputting the resulting voltage. "A" represents the gain, and is a value larger than 1.

When the imaginary unit is denoted by j, the angular frequency of alternating current is by ω, and the capacitance of the feedback capacitor 82 is by $C_F$, the input impedance $Z_{in}$ of the negative capacitance circuit section 80 can be expressed by Formula (6) below.

$$Z_{in}=-1/j\omega C_F(A-1) \qquad (6)$$

Therefore, when a second alternating voltage $V_{IN1}$ with large parasitic capacitance is inputted to the negative capacitance circuit section 80, parasitic capacitance included in the second alternating voltage $V_{IN}$ is reduced by negative capacitance. As a result, the negative capacitance circuit section 80 can output a second alternating voltage $_{IN2}$ with small parasitic capacitance. Thereby, the distortion of the pulse wave of the second alternating voltage in, is reduced, and therefore the switched capacitor circuit 50 can sense the amplitude of a rise edge or a fall edge of the pulse wave with high precision.

Figure 11:
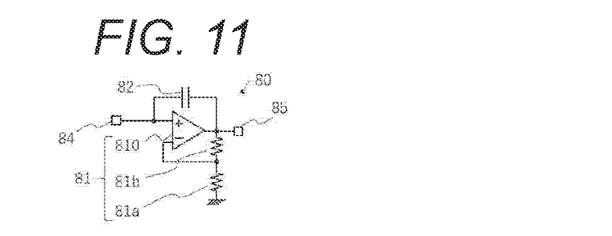
FIG. 11 is a circuit diagram of an embodiment of a negative capacitance circuit section according to the present technology.

Hereinbelow, practical examples of the negative capacitance circuit section 80 are described with reference to FIGS. 11 to 18. FIG. 11 is a circuit diagram of an embodiment of the negative capacitance circuit section 80 according to the present technology. As shown in FIG. 11, the negative capacitance circuit section 80 includes at least a differential amplifier 810, a first resistor 81a, a second resistor 81b, a feedback capacitor 82, an input terminal 84, and an output terminal 85. The differential amplifier 810, the first resistor 81a, and the second resistor 81b serve as the amplification section 81. Note that the negative capacitance circuit section 80 can be obtained by using, for example, a negative impedance converter (NIC) or the like.

The feedback capacitor 82 is connected between a noninverting input terminal possessed by the differential amplifier 810 and an output terminal possessed by the differential amplifier 810. The second resistor 81b is connected between an inverting input terminal possessed by the differential amplifier 810 and an output terminal possessed by the differential amplifier 810. The second resistor 81b, the first resistor 81a, and GND are connected in series in this order. The inverting input terminal possessed by the differential amplifier 810 is connected between the first resistor 81a and the second resistor 81b.

When the resistance value of the first resistor 81a is denoted by $R_a$ and the resistance value of the second resistor 81b is by $R_b$, the gain "A" is found by Formula (7) below.

$$A=1+R_b/R_a \qquad (7)$$

Therefore, by applying Formula (7) above to Formula (6) above, the input impedance $Z_{in}$ of the negative capacitance circuit section 80 is found by Formula (8) below.

$$Z_{in}=-1/(j\omega C_F R_b/R_a) \qquad (8)$$

Therefore, when a second alternating voltage $V_{IN1}$ with large parasitic capacitance is inputted to the negative capacitance circuit section 80, parasitic capacitance included in the second alternating voltage $V_{IN}$ is reduced by negative capacitance. As a result, the negative capacitance circuit section 80 can output a second alternating voltage $_{IN2}$ with small parasitic capacitance. Thereby, the distortion of the pulse wave of the second alternating voltage $I_{N2}$ is reduced, and therefore the switched capacitor circuit 50 can sense the amplitude of a rise edge or a fall edge of the pulse wave with high precision.

In order to stabilize the second alternating voltage $V_{IN}$ inputted to the negative capacitance circuit section 80, the negative capacitance circuit section 80 may further include a bias resistor. The bias resistor is a resistor having the function of stabilizing alternating voltage.

Figure 12:
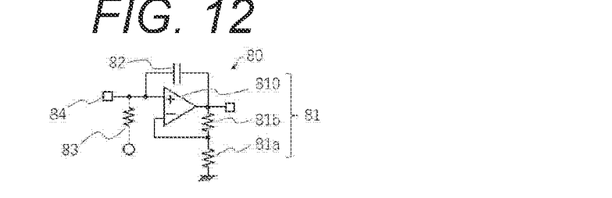
FIG. 12 is a circuit diagram of an embodiment of a negative capacitance circuit section according to the present technology.

This will now be described with reference to FIG. 12. FIG. 12 is a circuit diagram of an embodiment of the negative capacitance circuit section 80 according to the present technology. As shown in FIG. 12, the negative capacitance circuit section 80 further includes a bias resistor 83. One terminal of the bias resistor 83 is connected between the input terminal 84 and the noninverting input terminal possessed by the differential amplifier 810.

The inputted second alternating voltage Vi, can be stabilized by a prescribed voltage being supplied to the bias resistor 83.

Incidentally, the negative capacitance circuit section 80 shown in FIG. 11 is connected to single-end wiring. Hence, the negative capacitance circuit section 80 includes one input terminal 84 and one output terminal 85.

Figure 13:
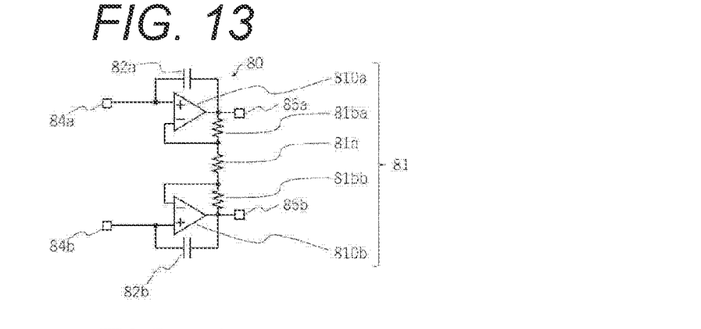
FIG. 13 is a circuit diagram of an embodiment of a negative capacitance circuit section according to the present technology.

On the other hand, the negative capacitance circuit section 80 may be connected to differential wiring. The negative capacitance circuit section 80 connected to differential wiring will now be described with reference to FIG. 13. FIG. 13 is a circuit diagram of an embodiment of the negative capacitance circuit section 80 according to the present technology. As shown in FIG. 13, the negative capacitance circuit section 80 includes at least a first differential amplifier 810a, a second differential amplifier 810b, a first resistor 81a, two second resistors (81ba, 81bb), a first feedback capacitor 82a, a second feedback capacitor 82b, a first input terminal 84a, a second input terminal 84b, a first output terminal 85a, and a second output terminal 85b. The two differential amplifiers (810a, 810b), the first resistor 81a, and the two second resistors (81ba, 81bb) serve as the amplification section 81.

The first feedback capacitor 82a is connected between a noninverting input terminal possessed by the first differential amplifier 810a and an output terminal possessed by the first differential amplifier 810a. The second resistor 81ba is connected between an inverting input terminal possessed by the first differential amplifier 810a and an output terminal possessed by the first differential amplifier 810a.

The second feedback capacitor 82b is connected between a noninverting input terminal possessed by the second differential amplifier 810b and an output terminal possessed by the second differential amplifier 810b. The second resistor 81bb is connected between an inverting input terminal possessed by the second differential amplifier 810b and an output terminal possessed by the second differential amplifier 810b.

The second resistor 81ba, the first resistor 81a, and the second resistor 81bb are connected in series in this order. An inverting input terminal possessed by the first differential amplifier 810a is connected between the first resistor 81a and the second resistor 81ba. An inverting input terminal possessed by the second differential amplifier 810b is connected between the first resistor 81a and the second resistor 81bb.

When the resistance value of the first resistor 81a is denoted by $2R_a$ and the resistance value of each of the two second resistors (82ba, 82bb) is by $R_b$, the input impedance $Z_{in}$ of the negative capacitance circuit section 80 is found by Formula (8) above.

In order to stabilize the second alternating voltage $V_{IN}$ inputted to the negative capacitance circuit section 80, the negative capacitance circuit section 80 may further include a bias resistor.

Figure 14:
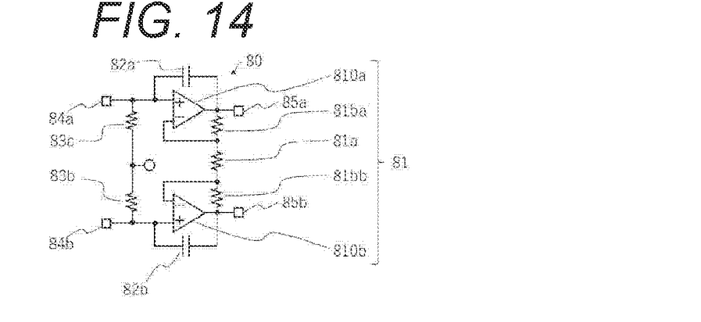
FIG. 14 is a circuit diagram of an embodiment of a negative capacitance circuit section according to the present technology.

This will now be described with reference to FIG. 14. FIG. 14 is a circuit diagram of an embodiment of the negative capacitance circuit section 80 according to the present technology. As shown in FIG. 14, the negative capacitance circuit section 80 further includes a first bias resistor 83a and a second bias resistor 83b.

The first bias resistor 83a and the second bias resistor 83b are connected in series. One terminal of the first bias resistor 83a is connected between the first input terminal 84a and the noninverting input terminal possessed by the first differential amplifier 810a. One terminal of the second bias resistor 83b is connected between the second input terminal 84b and the noninverting input terminal possessed by the second differential amplifier 810b.

The inputted second alternating voltage $V_{1N}$ can be stabilized by a prescribed voltage being supplied to each of the two bias resistors (83a, 83b).

Figure 15:
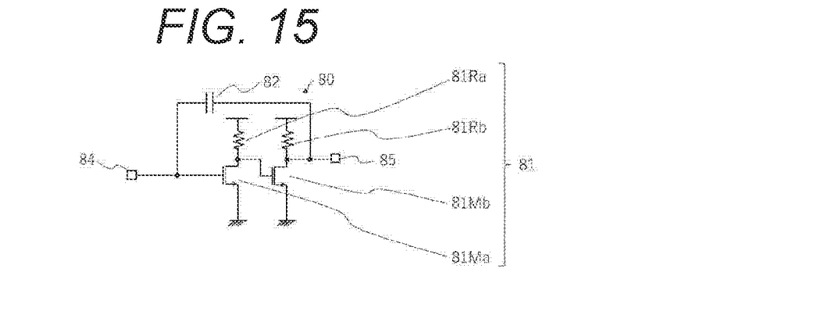
FIG. 15 is a circuit diagram of an embodiment of a negative capacitance circuit section according to the present technology.

Another practical example of the negative capacitance circuit section 80 will now be described with reference to FIG. 15. FIG. 15 is a circuit diagram of an embodiment of the negative capacitance circuit section 80 according to the present technology. As shown in FIG. 14, the negative capacitance circuit section 80 includes at least a first transistor 81Ma, a second transistor 81Mb, a first resistor 81Ra, a second resistor 81Rb, and a feedback capacitor 82. The two transistors (81Ma, 81Mb) and the two resistors (81Ra, 81Rb) serve as the amplification section 81.

The first transistor 81Ma and the second transistor 81Mb can be obtained by using, for example, metal-oxide-semiconductor field-effect transistors (MOSFETs) or the like. This MOSFET may be, for example, an n-type MOSFET or a p-type MOSFET. Hereinbelow, a practical example in which the first transistor 81Ma and the second transistor 81Mb are n-type MOSFETs is described.

The feedback capacitor 82 is connected between a gate possessed by the first transistor 81Ma and a drain possessed by the second transistor 81Mb. A drain possessed by the first transistor 81Ma and a gate possessed by the second transistor 81Mb are connected together. The first resistor 81Ra is connected between the drain possessed by the first transistor 81Ma and VDD. The second resistor 81Rb is connected between the drain possessed by the second transistor 81Mb and VDD.

When the mutual conductance of each of the first transistor 81Ma and the second transistor 81Mb is denoted by gm and the resistance value of each of the first resistor 81Ra and the second resistor 81Rb is by $R_L$, the gain "A" is found by Formula (9) below.

$$A = gm^2 R_L^2 \qquad (9)$$

Therefore, by applying Formula (9) above to Formula (6) above, the input impedance $Z_{in}$ of the negative capacitance circuit section 80 is found by Formula (10) below.

$$Z_{in} = -1/(j\omega C_F gm^2 R_L^2 - 1) \qquad (10)$$

Therefore, when a second alternating voltage $V_{IN1}$ with large parasitic capacitance is inputted to the negative capacitance circuit section 80, parasitic capacitance included in the second alternating voltage $V_{IN}$ is reduced by negative capacitance. As a result, the negative capacitance circuit section 80 can output a second alternating voltage $_{IN2}$ with small parasitic capacitance. Thereby, the distortion of the pulse wave of the second alternating voltage $_{IN2}$ is reduced, and therefore the switched capacitor circuit 50 can sense the amplitude of a rise edge or a fall edge of the pulse wave with high precision.

Note that, in a case where the first transistor 81Ma and the second transistor 81Mb are p-type MOSFETs, a resistor may be connected between a source possessed by the first transistor 81Ma and GND. Similarly, a resistor may be connected between a source possessed by the second transistor 81Mb and GND.

In order to stabilize the second alternating voltage $V_{IN}$ inputted to the negative capacitance circuit section 80, the negative capacitance circuit section 80 may further include a bias resistor.

Figure 16:
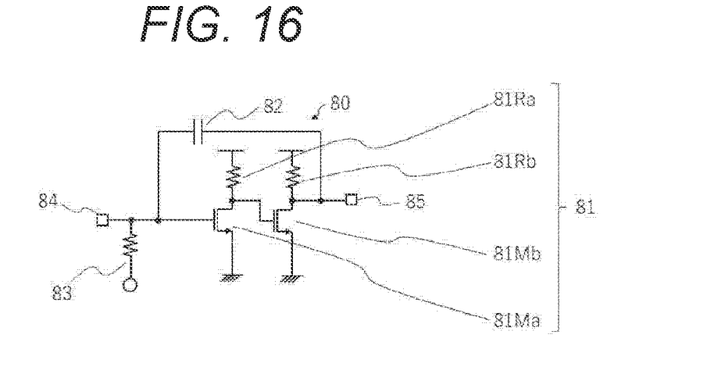
FIG. 16 is a circuit diagram of an embodiment of a negative capacitance circuit section according to the present technology.

This will now be described with reference to FIG. 16. FIG. 16 is a circuit diagram of an embodiment of the negative capacitance circuit section 80 according to the present technology. As shown in FIG. 16, the negative capacitance circuit section 80 further includes a bias resistor 83.

One terminal of the bias resistor 83 is connected between the input terminal 84 and the first transistor 81Ma.

The inputted second alternating voltage $V_{IN}$ can be stabilized by a prescribed voltage being supplied to the bias resistor 83.

Incidentally, the negative capacitance circuit section 80 shown in FIG. 15 is connected to single-end wiring. Hence, the negative capacitance circuit section 80 includes one input terminal 84 and one output terminal 85.

Figure 17:
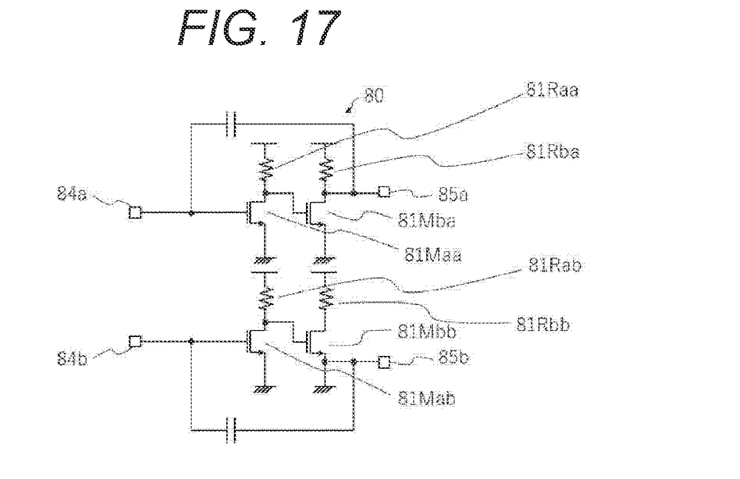
FIG. 17 is a circuit diagram of an embodiment of a negative capacitance circuit section according to the present technology.

On the other hand, the negative capacitance circuit section 80 may be connected to differential wiring. The negative capacitance circuit section 80 connected to differential wiring will now be described with reference to FIG. 17. FIG. 17 is a circuit diagram of an embodiment of the negative capacitance circuit section 80 according to the present technology. Note that a detailed description of the configuration is omitted.

When the mutual conductance of each of the four transistors (81Maa, 81Mba, 81Mab, 81Mbb) is denoted by gm and the resistance value of each of the four resistors (81Raa, 81Rba, 81Rab, 81Rbb) is by $R_L$, the input impedance $Z_{in}$ of the negative capacitance circuit section 80 is found by Formula (10) above.

In order to stabilize the second alternating voltage $V_{IN}$ inputted to the negative capacitance circuit section 80, the negative capacitance circuit section 80 may further include a bias resistor.

Figure 18:
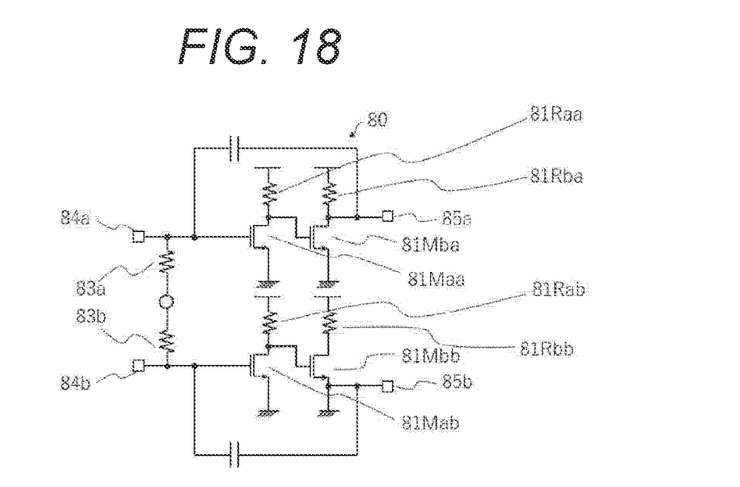
FIG. 18 is a circuit diagram of an embodiment of a negative capacitance circuit section according to the present technology.

This will now be described with reference to FIG. 18. FIG. 18 is a circuit diagram of an embodiment of the negative capacitance circuit section 80 according to the present technology. Note that a detailed description of the configuration is omitted.

The inputted second alternating voltage $V_{IN}$ can be stabilized by a prescribed voltage being supplied to each of the two bias resistors (83a, 83b).

Note that the position where the bias resistor is placed is not limited to the positions shown in the drawings. The position where the bias resistor is placed may be any position whereby the second alternating voltage $V_{IN}$ outputted by the second coil 20 is stabilized. Further, in a case where the second coil 20 has a center tap, the second alternating voltage $V_{IN}$ can be stabilized by supplying a prescribed voltage to the center tap.

Note that the effects described in the present specification are merely examples, and not limitative; other effects may be exhibited.

Additionally, the present technology may also be configured as below.

[1] A proximity sensor including:
a reference signal generation circuit section 30;
a first coil;
a second coil;
a clock signal generation circuit section; and
a switched capacitor circuit section, in which the reference signal generation circuit section 30 applies a first alternating voltage to the first coil and transmits a reference signal synchronized with the first alternating voltage to the clock signal generation circuit section, the second coil coupled with the first coil by magnetic field coupling generates a second alternating voltage correlated with a coupling coefficient of the first coil and the second coil, the clock signal generation circuit section transmits a plurality of clock signals corresponding to the reference signal to the switched capacitor circuit section, and the switched capacitor circuit section detects a distance between the first coil and the second coil by acquiring the second alternating voltage at a timing when each of the plurality of clock signals changes.

[2] The proximity sensor according to [1], in which,
on the basis of the reference signal, the clock signal generation circuit section transmits to the switched capacitor circuit section a first clock signal that changes at a timing immediately after the second alternating voltage has changed from a negative side to a positive side and a second clock signal that changes at a timing immediately before the second alternating voltage changes from the negative side to the positive side, and the switched capacitor circuit section acquires a voltage difference between the second alternating voltage acquired at a timing when the first clock signal has changed and the second alternating voltage acquired at a timing when the second clock signal has changed.

[3] The proximity sensor according to [1] or [2], in which
the switched capacitor circuit section includes
a plurality of charging switches,
a plurality of discharging switches,
a plurality of sampling capacitors, and
a differential amplifier.

[4] The proximity sensor according to [3], in which
each of the charging switches corresponds to any one of the plurality of clock signals and the charging switch corresponding to the clock signal is set to ON or OFF at a timing when the clock signal has changed, each of the discharging switches corresponds to any one of the plurality of clock signals and the discharging switch corresponding to the clock signal is set to ON or OFF at a timing when the clock signal has changed, each of the sampling capacitors corresponds to any one of the plurality of clock signals, and the second alternating voltage inputted to the switched capacitor circuit section is charged by the charging switch connected to the sampling capacitor being set to ON and the discharging switch connected to the sampling capacitor being set to OFF and the second alternating voltage is discharged by the charging switch connected to the sampling capacitor being set to OFF and the discharging switch connected to the sampling capacitor being set to ON, and the differential amplifier amplifies the second alternating voltage discharged by each of the sampling capacitors and outputs a resulting voltage.

[5] The proximity sensor according to [2], in which,
on the basis of the reference signal, the clock signal generation circuit section transmits to the switched capacitor circuit section a third clock signal that changes at a timing immediately after the second alternating voltage has changed from the positive side to the negative side and a fourth clock signal that changes at a timing immediately before the second alternating voltage changes from the positive side to the negative side, the voltage difference is taken as a first voltage difference, and the switched capacitor circuit section acquires a second voltage difference between the second alternating voltage acquired at a timing when the third clock signal has changed and the second alternating voltage acquired at a timing when the fourth clock signal has changed, and the first voltage difference.

[6] The proximity sensor according to [5], in which the switched capacitor circuit section acquires a difference between the first voltage difference and the second voltage difference.

[7] The proximity sensor according to any one of [1] to [6], further including an A/D converter, in which the A/D converter converts an output voltage of the switched capacitor circuit section to a digital signal and outputs a voltage signal.

[8] The proximity sensor according to [7], further including a coupling coefficient calculation section, in which the coupling coefficient calculation section calculates a coupling coefficient of the first coil and the second coil on the basis of the voltage signal.

[9] The proximity sensor according to any one of [1] to [8], further including a negative capacitance circuit section, in which the negative capacitance circuit section reduces parasitic capacitance included in the second alternating voltage and resulting from the second coil.

REFERENCE SIGNS LIST

10 First coil
20 Second coil
30 Reference signal generation circuit section
40 Clock signal generation circuit section
50 Switched capacitor circuit section
51-1 First charging switch group
51-2 Second charging switch group
51-3 Third charging switch group
51-4 Fourth charging switch group
52-1 First discharging switch group
52-2 Second discharging switch group
52-3 Third discharging switch group
52-4 Fourth discharging switch group
53-1 First sampling capacitor group
53-2 Second sampling capacitor group
53-3 Third sampling capacitor group
53-4 Fourth sampling capacitor group
54 Feedback capacitor group
55 Differential amplifier
56-1 Input terminal
56-2 Input terminal
57-1 Output terminal
57-2 Output terminal
58 Ground
60 A/D converter
70 Coupling coefficient calculation section
80 Negative capacitance circuit section
81 Amplification section
82 Feedback capacitor
$V_R$ First alternating voltage
$V_{IN}$ Second alternating voltage
$V_{OUT}$ Output voltage
f Magnetic field
k Coupling coefficient
i Distance between coils
R Reference signal
P1 First clock signal
P1A Second clock signal
P2 Third clock signal
P2A Fourth clock signal
T Period
D Duty ratio
τ Sampling interval
a to d Timing
$C_S$ Capacitance of sampling capacitor
$C_F$ Capacitance of feedback capacitor

The invention claimed is:

1. A proximity sensor comprising:
a reference signal generation circuit section;
a first coil;
a second coil;
a clock signal generation circuit section; and
a switched capacitor circuit section,
wherein the reference signal generation circuit section applies a first alternating voltage to the first coil and transmits a reference signal synchronized with the first alternating voltage to the clock signal generation circuit section,
the second coil coupled with the first coil by magnetic field coupling generates a second alternating voltage correlated with a coupling coefficient of the first coil and the second coil,
the clock signal generation circuit section transmits a plurality of clock signals corresponding to the reference signal to the switched capacitor circuit section, and
the switched capacitor circuit section detects a distance between the first coil and the second coil by acquiring the second alternating voltage at a timing when each of the plurality of clock signals changes.

2. The proximity sensor according to claim 1, wherein, on a basis of the reference signal, the clock signal generation circuit section transmits to the switched capacitor circuit section a first clock signal that changes at a timing immediately after the second alternating voltage has changed from a negative side to a positive side and a second clock signal that changes at a timing immediately before the second alternating voltage changes from the negative side to the positive side, and the switched capacitor circuit section acquires a voltage difference between the second alternating voltage acquired at a timing when the first clock signal has changed and the second alternating voltage acquired at a timing when the second clock signal has changed.

3. The proximity sensor according to claim 1, wherein the switched capacitor circuit section includes
a plurality of charging switches,
a plurality of discharging switches,
a plurality of sampling capacitors, and
a differential amplifier.

4. The proximity sensor according to claim 3, wherein each of the charging switches corresponds to any one of the plurality of clock signals and the charging switch corresponding to the clock signal is set to ON or OFF at a timing when the clock signal has changed, each of the discharging switches corresponds to any one of the plurality of clock signals and the discharging switch corresponding to the clock signal is set to ON or OFF at a timing when the clock signal has changed, each of the sampling capacitors corresponds to any one of the plurality of clock signals, and the second alternating voltage inputted to the switched capacitor circuit section is charged by the charging switch connected to the sampling capacitor being set to ON and the discharging switch connected to the sampling capacitor being set to OFF and the second alternating voltage is discharged by the charging switch connected to the sampling capacitor being set to OFF and the discharging switch connected to the sampling capacitor being set to ON, and the differential amplifier amplifies the second alternating voltage discharged by each of the sampling capacitors and outputs a resulting voltage.

5. The proximity sensor according to claim 2, wherein, on a basis of the reference signal, the clock signal generation circuit section transmits to the switched capacitor circuit section a third clock signal that changes at a timing immediately after the second alternating voltage has changed from the positive side to the negative side and a fourth clock signal that changes at a timing immediately before the second alternating voltage changes from the positive side to the negative side, the voltage difference is taken as a first voltage difference, and the switched capacitor circuit section acquires a second voltage difference between the second alternating voltage acquired at a timing when the third clock signal has changed and the second alternating voltage acquired at a timing when the fourth clock signal has changed, and the first voltage difference.

6. The proximity sensor according to claim 5, wherein the switched capacitor circuit section acquires a difference between the first voltage difference and the second voltage difference.

7. The proximity sensor according to claim 1, further comprising an A/D converter, wherein the A/D converter converts an output voltage of the switched capacitor circuit section to a digital signal and outputs a voltage signal.

8. The proximity sensor according to claim 7, further comprising a coupling coefficient calculation section, wherein the coupling coefficient calculation section calculates a coupling coefficient of the first coil and the second coil on a basis of the voltage signal.

9. The proximity sensor according to claim 1, further comprising a negative capacitance circuit section, wherein the negative capacitance circuit section reduces parasitic capacitance included in the second alternating voltage and resulting from the second coil.

\* \* \* \* \*